(12) United States Patent
Yoshinaga et al.

(10) Patent No.: US 11,437,892 B2
(45) Date of Patent: Sep. 6, 2022

(54) MOTOR

(71) Applicant: NIDEC CORPORATION, Kyoto (JP)

(72) Inventors: Masaki Yoshinaga, Kyoto (JP);
Tomohiro Fukumura, Kyoto (JP);
Taro Amagai, Kyoto (JP); Akiko Ikeda, Kyoto (JP); Kengo Araki, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 330 days.

(21) Appl. No.: 16/841,614

(22) Filed: Apr. 6, 2020

(65) Prior Publication Data
US 2020/0336047 A1 Oct. 22, 2020

(30) Foreign Application Priority Data

Apr. 18, 2019 (JP) .............................. JP2019-079356

(51) Int. Cl.
*H02K 11/215* (2016.01)
*H02P 23/14* (2006.01)
*G01R 33/00* (2006.01)
*H02K 11/33* (2016.01)

(52) U.S. Cl.
CPC ....... *H02K 11/215* (2016.01); *G01R 33/0017* (2013.01); *H02K 11/33* (2016.01); *H02P 23/14* (2013.01)

(58) Field of Classification Search
CPC .. H02K 11/215; H02K 11/33; G01R 33/0017; G01R 33/0029; G01R 33/072; G01R 33/02; H02P 23/14; H02P 6/16
See application file for complete search history.

(56) References Cited

U.S. PATENT DOCUMENTS

| 3,999,108 | A | * | 12/1976 | Tanikoshi | H02P 6/06 318/400.38 |
| 4,760,315 | A | * | 7/1988 | Nanae | H02P 6/14 318/400.38 |
| 2007/0263992 | A1 | * | 11/2007 | Tamaoka | H02P 6/28 388/804 |
| 2010/0026282 | A1 | * | 2/2010 | Kaita | G01B 7/30 324/207.25 |
| 2010/0219781 | A1 | * | 9/2010 | Kuwamura | H02P 27/08 318/400.04 |

FOREIGN PATENT DOCUMENTS

| GB | 2135483 | A | * | 8/1984 | ............. G05F 1/561 |
| JP | 04075491 | A | * | 3/1992 | ............... H02P 6/08 |
| JP | 2012-47630 | A | | 3/2012 | |

* cited by examiner

*Primary Examiner* — Mohamad A Musleh
(74) *Attorney, Agent, or Firm* — Hauptman Ham, LLP

(57) ABSTRACT

An offset of an output voltage of a magnetic sensor caused by an external magnetic field is removed. A motor according to a disclosed embodiment includes: a first magnetic sensor that detects a rotational position of a rotor; a second magnetic sensor that is arranged at a predetermined mechanical angle with respect to the first magnetic sensor and detects the rotational position of the rotor; a signal amplifier that amplifies a difference between a first signal which is a signal output from the first magnetic sensor and a second signal which is a signal output from the second magnetic sensor; and a pulse signal generator that converts an output signal of the signal amplifier into a pulse signal.

3 Claims, 14 Drawing Sheets

MOTOR

CROSS-REFERENCE TO RELATED APPLICATIONS

The present invention claims priority under 35 U.S.C. § 119 to Japanese Application No. 2019-079356 filed on Apr. 18, 2019, the entire content of which is incorporated herein by reference.

FIELD OF THE INVENTION

The present disclosure relates to a motor.

BACKGROUND

Conventionally, there has been known a circuit that cancels an output offset for a magnetic sensor, such as a Hall element, that changes according to the magnitude of a magnetic force. For example, there has been known an offset cancellation circuit of a Hall element configured to cancel an offset caused by a parasitic capacitance of a capacitor in a circuit.

Meanwhile, a Hall element is widely used as a magnetic sensor to detect a position of a rotor in a motor. A signal of the Hall element is amplified by a signal processing circuit, supplied to a microcontroller, and used for control of motor driving. Here, if an external magnetic field, such as a permanent magnet, is brought close to the motor, an offset occurs in the signal from the magnetic sensor, so that there is a problem that the signal of the Hall element is not accurately transmitted to the microcontroller. However, conventionally, a method for removing the offset caused by the external magnetic field has not been known.

SUMMARY

An exemplary embodiment of the present disclosure is a motor including: a first magnetic sensor that detects a rotational position of a rotor; a second magnetic sensor that is arranged at a predetermined mechanical angle with respect to the first magnetic sensor and detects the rotational position of the rotor; a signal amplifier that amplifies a difference between a first signal which is a signal output from the first magnetic sensor and a second signal which is a signal output from the second magnetic sensor; and a pulse signal generator that converts an output signal of the signal amplifier into a pulse signal.

The above and other elements, features, steps, characteristics and advantages of the present disclosure will become more apparent from the following detailed description of the preferred embodiments with reference to the attached drawings.

DETAILED DESCRIPTION

Hereinafter, a motor drive system which is an embodiment of a drive system of the present disclosure will be described.

In the following embodiments, a configuration including at least a three-phase AC motor, a plurality of Hall elements, and a signal processing circuit of each Hall element corresponds to a motor of the present disclosure.

Hereinafter, an embodiment of a motor drive system of the present disclosure will be described with reference to the drawings.

Figure 1:
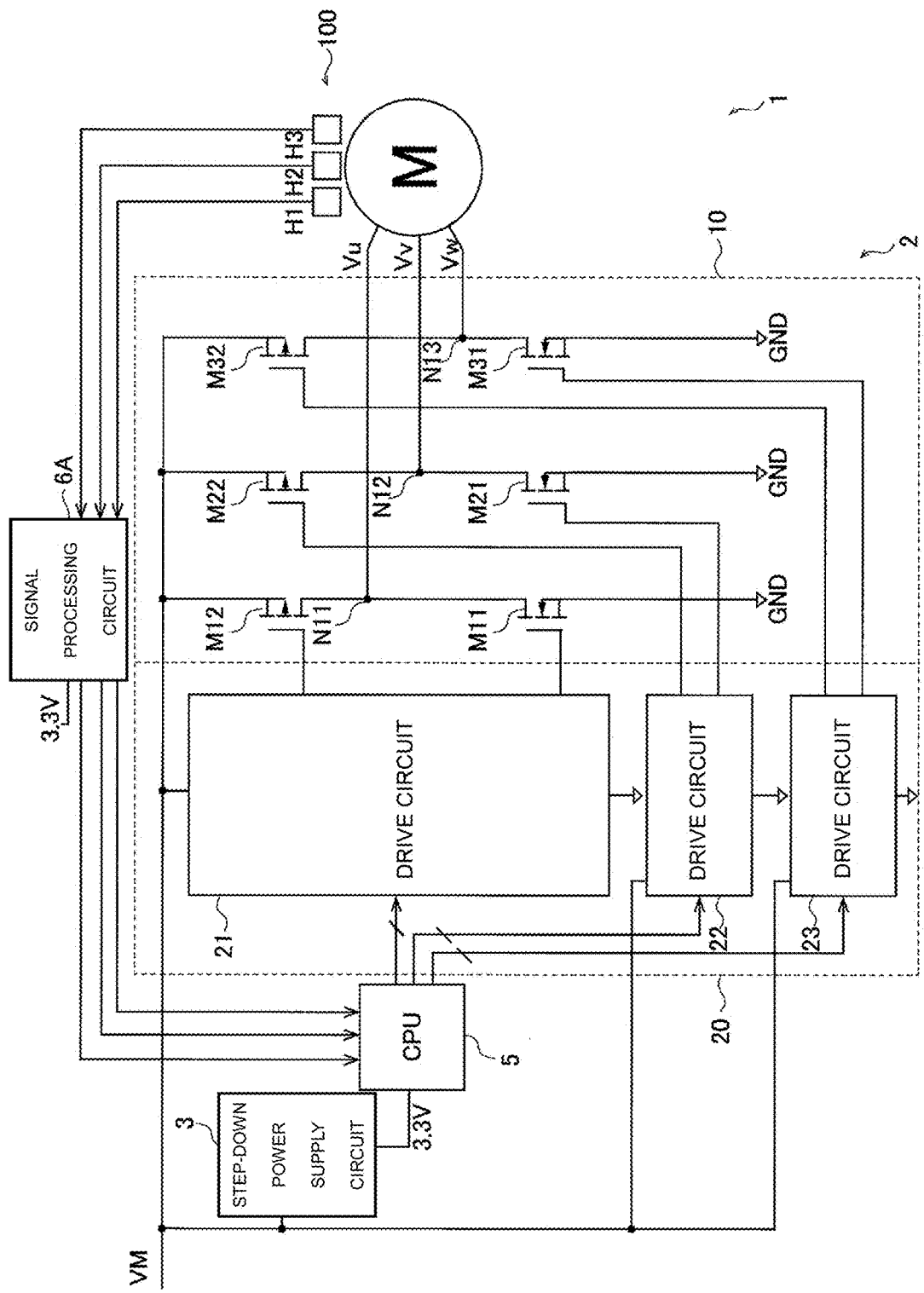
FIG. 1 is a diagram showing a system configuration of a motor drive system according to a first embodiment.

FIG. 1 is a diagram showing a system configuration of a motor drive system 1 according to the embodiment. The motor drive system 1 includes an inverter device 2, a step-down power supply circuit 3, a central processing unit (CPU) 5, and a three-phase AC motor M. The CPU 5 is an example of a microcontroller.

The inverter device 2 includes a three-phase voltage generation unit 10 and a drive circuit group 20, generates three-phase AC power, and supplies the three-phase AC power to a three-phase AC motor M. The three-phase AC motor M is provided with a Hall element group 100 for each phase for detecting a position of a rotor.

In the following description, a voltage of a node or a terminal in a circuit means a potential with a ground potential GND (hereinafter, referred to as a "GND potential") as a reference. For example, the highest potential in the inverter device 2 is a power supply potential VM, but the GND potential may be regarded as 0 V, and accordingly, is also referred to as "power supply voltage VM" as appropriate.

The step-down power supply circuit 3 reduces the power supply voltage VM to a predetermined voltage (+3.3 V in the present embodiment) required for the operation of the CPU 5, and supplies the power supply voltage VM to the CPU 5.

The CPU 5 supplies a pulse signal having an amplitude of 3.3 V to each of drive circuits 21 to 23 of the drive circuit group 20. Each drive circuit converts the pulse signal from the CPU 5 to a signal level at which a MOS transistor in the three-phase voltage generation unit 10 can operate.

In FIG. 1, the drive circuits 21 to 23 respectively correspond to nodes N11 to N13 and correspond to output terminals of a drive circuit to be described below.

Hereinafter, the configuration of the inverter device 2 will be described in detail.

As shown in FIG. 1, the three-phase voltage generation unit 10 of the inverter device 2 includes NMOS transistors M11, M21, and M31 as low-side switches and PMOS transistors M12, M22, and M32 as high-side switches. Since the three-phase AC motor M may operate at 100% duty in some cases, the three-phase voltage generation unit 10 uses the high-side switch as the PMOS transistor.

In the description of the present embodiment, an example in which a high-side switch is a PMOS transistor will be described, but the disclosure is not limited thereto. For example, an NMOS transistor may be applied as the high-side switch using a bootstrap circuit.

In the present embodiment, the PMOS transistor M12 and the NMOS transistor M1 are provided for a U phase of three-phase AC power supplied to the three-phase AC motor M. The PMOS transistor M12 and the NMOS transistor M1 perform the switching operation to generate a U-phase voltage Vu which is a U-phase output voltage.

Similarly, the PMOS transistor M22 and the NMOS transistor M21 are provided for a V phase of the three-phase AC power supplied to the three-phase AC motor M. The PMOS transistor M22 and the NMOS transistor M21 perform the switching operation to generate a V-phase voltage Vv which is a V-phase output voltage. The PMOS transistor M32 and the NMOS transistor M31 are provided for a W phase of the three-phase AC power supplied to the three-phase AC motor M. The PMOS transistor M32 and the NMOS transistor M31 perform the switching operation to generate a W-phase voltage Vw which is a W-phase output voltage.

Each of the NMOS transistors M11, M21, and M31 has a source set to the ground potential GND. Each of the PMOS transistors M12, M22, M32 has a source connected to the power supply voltage VM of the inverter device 2.

A common drain (the node N11) of the NMOS transistor M11 and the PMOS transistor M12 of the U phase is connected to one end of a U-phase winding (not shown) of the three-phase AC motor M. Similarly, a common drain (the node N12) of the NMOS transistor M21 and the PMOS transistor M22 of the V phase is connected to one end of a V-phase winding (not shown) of the three-phase AC motor M, and a common drain (the node N13) of the NMOS transistor M31 and the PMOS transistor M32 of the W phase is connected to one end of a W-phase winding (not shown) of the three-phase AC motor M.

The Hall element group 100 includes three Hall elements H1, H2, and H3. In the following description, when the three Hall elements will be simply described as "Hall elements H" when being commonly referred to. The Hall elements H1 to H3 are elements that detect a position of a rotor magnet of the three-phase AC motor M, and are elements that convert the magnitude of a magnetic force that changes in accordance with the rotation of the rotor magnet (also simply referred to as a "rotor" as appropriate) of the three-phase AC motor M into an electric signal. Signals of the three Hall elements H1, H2, and H3 are complementary signals each of which is a pair of signals inverted from each other with respect to a reference voltage, are sine wave signals having a phase difference of 120 degrees in order, and correspond to the U phase, the V phase, and the W phase, respectively.

A signal processing circuit 6A amplifies a signal of each Hall element H, converts the signal into a pulse signal having an amplitude of 3.3 V, and supplies the pulse signal to the CPU 5. Details of the signal processing circuit 6A will be described below. A duty ratio of the pulse signal supplied from the signal processing circuit 6A is usually 50%, and does not largely deviate from 50%.

The CPU 5 determines the duty ratio of the pulse signal supplied to the driving circuits 21 to 23 of the drive circuit group 20 based on the pulse signal to be supplied by the signal processing circuit 6A, and supplies the pulse signal with the determined duty ratio to each drive circuit. The amplitude of the pulse signal to be supplied to each drive circuit is 3.3 V, which is the same as an operating voltage of the CPU 5.

Each drive circuit of the drive circuit group 20 converts a level of the pulse signal from the CPU 5 having the amplitude of 3.3 V, and inputs the converted pulse signal to a gate of the PMOS transistor and a gate of the NMOS transistor of the three-phase voltage generation unit 10. The drive circuit 21 inputs the level-converted pulse signal to each gate of the NMOS transistor M11 and PMOS transistor M12 of the U phase. The drive circuit 22 inputs the level-converted pulse signal to each gate of the NMOS transistor M21 and PMOS transistor M22 of the V phase. The drive circuit 23 inputs the level-converted pulse signal to each gate of the NMOS transistor M31 and PMOS transistor M32 of the W phase.

The operations of the NMOS transistors M11, M21, and M31 as the low-side switches and the PMOS transistors M12, M22, and M32 as the high-side switches are controlled by the pulse signals whose levels have been converted by the drive circuits 21, 22, and 23, respectively.

Hereinafter, the configuration of the signal processing circuit 6A of the present embodiment will be described in detail, but a reference circuit 6R, which is a signal processing circuit for reference, will be described with reference to FIGS. 2 and 3 first for the purpose of comparison with the signal processing circuit 6A.

Figure 2:
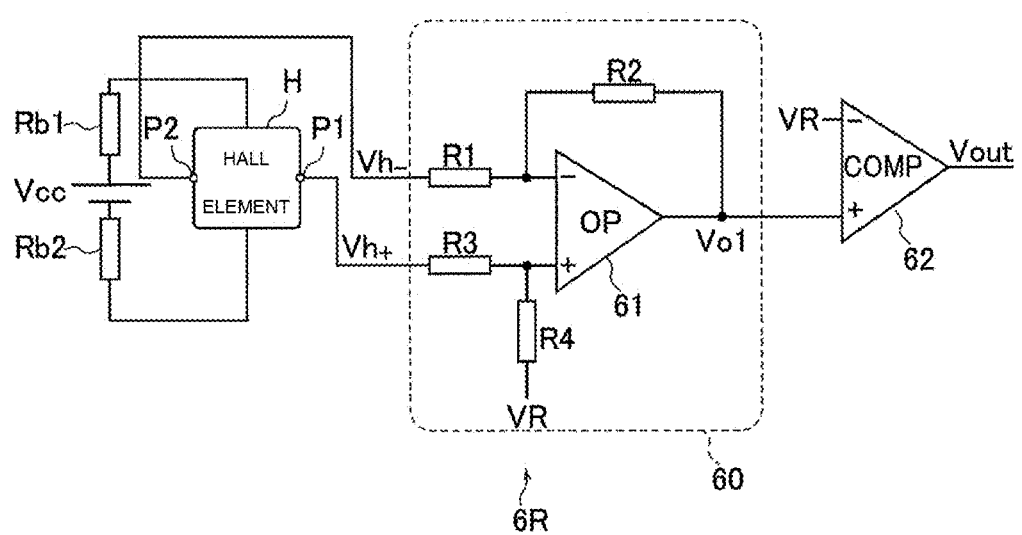
FIG. 2 is a circuit diagram of a reference circuit.
Figure 3A:
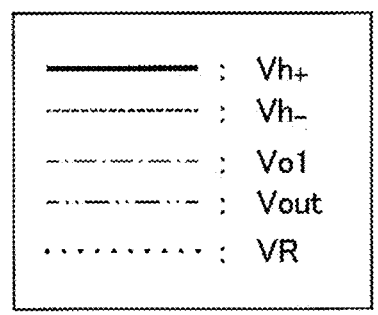
FIGS. 3A and 3B are timing charts showing the operation of the reference circuit.
Figure 3A:
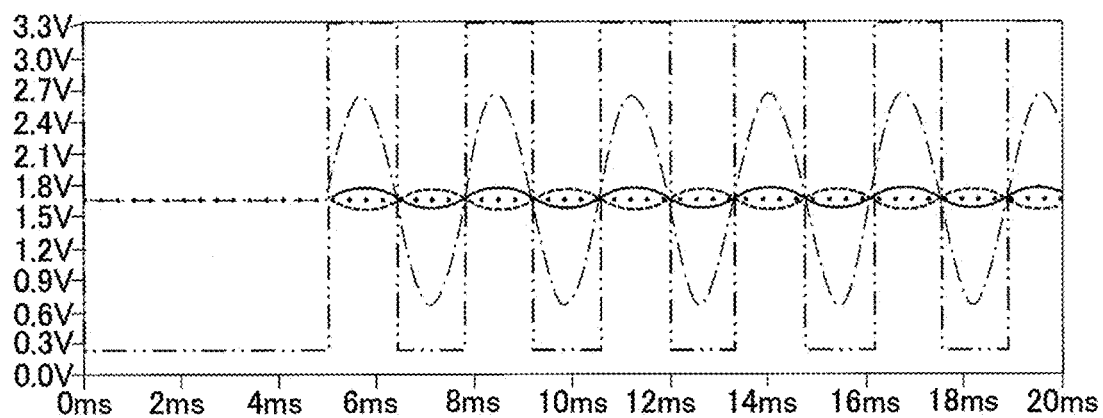
Figure 3B:
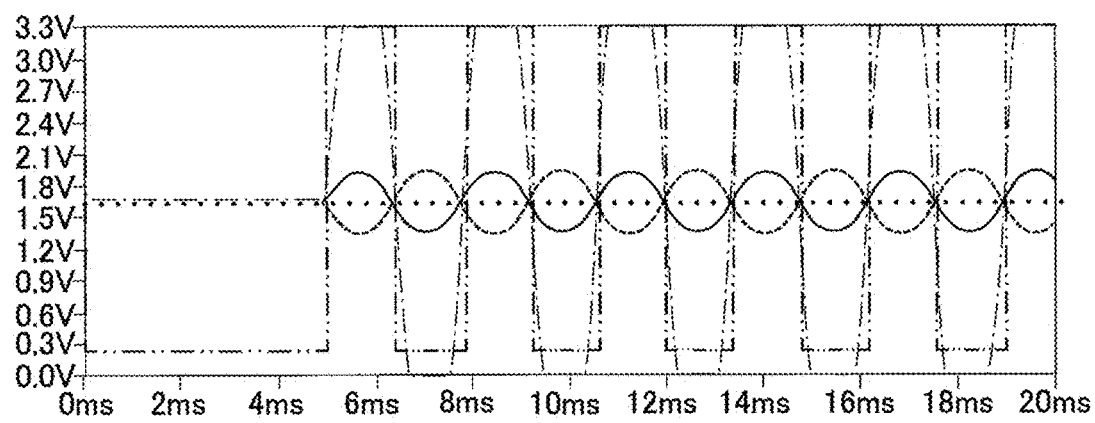

FIG. 2 is a circuit diagram of the reference circuit 6R. FIGS. 3A and 3B are timing charts showing the operation of the reference circuit 6R. Although a signal processing circuit for one Hall element H (for example, the Hall element H1) in the Hall element group 100 is shown in the reference circuit 6R shown in FIG. 2, a signal processing for the Hall elements H of other phases (for example, the Hall elements H2 and H3) is the same.

As shown in FIG. 2, in order to generate a predetermined bias voltage or bias current for the Hall element H, resistors Rb1 and Rb2 are provided for a power supply voltage Vcc. A pair of complementary signals, that is, a Hall element signal Vh+ and a Hall element signal Vh− are output from output terminals P1 and P2 of the Hall element H, respectively. The Hall element signal Vh+ and the Hall element signal Vh− are sine wave signals having phases opposite to each other with respect to the reference voltage VR (that is, signals having different polarities with respect to the reference voltage VR).

In the example of the present embodiment, the reference voltage VR is a voltage of a half level of the power supply voltage Vcc.

The reference circuit 6R includes a signal amplifier 60 and a comparator 62. The signal amplifier 60 includes a differential amplifier 61 and resistors R1 to R4.

The differential amplifier 61 is a differential amplifier, amplifies the signals Vh+ and Vh− of the Hall element H, and outputs a signal of a voltage Vo1. The resistor R1 is provided between the output terminal P2 of the Hall element H and an inverting input terminal of the differential amplifier 61, and the resistor R3 is provided between the output terminal P1 of the Hall element H and a non-inverting input terminal of the differential amplifier 61.

A feedback resistor R2 is provided between the inverting input terminal and an output terminal of the differential amplifier 61. One end of the resistor R4 is connected to the non-inverting input terminal of the differential amplifier 61, and the other end of the resistor R4 is set to the reference voltage VR.

Typically, the signal amplifier 60 is set such that R2/R1=R4/R3, and this value becomes an amplification factor (gain) of the signal amplifier 60.

The comparator 62 (an example of a pulse signal generator) compares the signal (output voltage Vo1) amplified and output by the signal amplifier 60 and the reference voltage VR, and outputs a binary pulse signal (output voltage Vout) indicating a result of the comparison. This pulse signal is supplied to the CPU 5.

FIGS. 3A and 3B show simulation results of waveforms of the Hall element signals Vh+ and Vh−, the output voltage Vo1 of the differential amplifier 61, the output voltage Vout of the comparator 62, and the reference voltage VR. FIG. 3A shows a case where the amplitude of the Hall element signal is 0.2 Vp-p and the gain of the signal amplifier 60 is five times. FIG. 3B shows a case where the amplitude of the Hall element signal is 0.6 Vp-p and the gain of the signal amplifier 60 is five times. When the output voltage Vo1 is Vp-p and exceeds the power supply voltage Vcc (3.3V) as shown in FIG. 3B, the output voltage Vo1 is clamped and does not become a sine wave. In both the cases of FIGS. 3A and 3B, the output voltage Vout has a pulse waveform with a 50% duty.

FIGS. 3A and 3B show a case where the reference circuit 6R operates normally. However, when there is a magnetic field other than a detection target outside, an offset occurs in the Hall element signals Vh+ and Vh−, so that the output voltage Vout does not have a 50% duty. This point is shown in FIG. 4.

Figure 4:
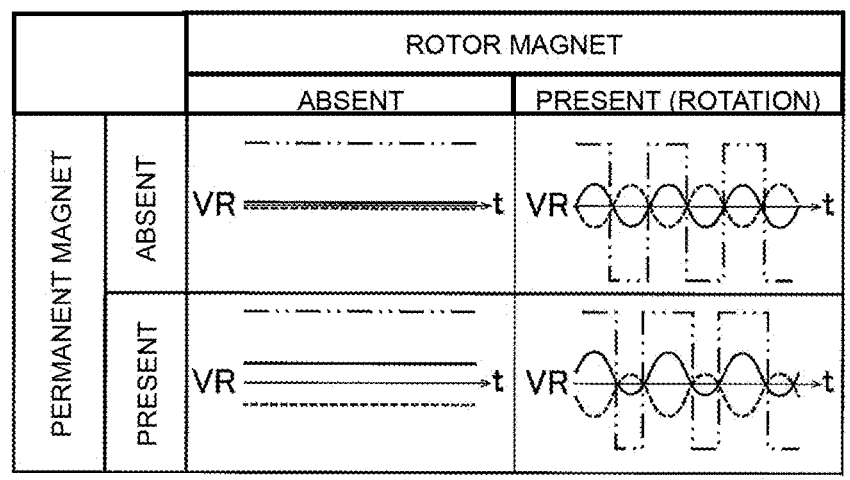
FIG. 4 is a view for describing an effect of an external magnetic field on a signal of a Hall element.
Figure 4:
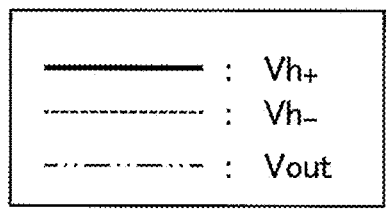

FIG. 4 is a view showing how the Hall element signals Vh+ and Vh− and the output voltage Vout (pulse) of the reference circuit 6R change between a case where there is no magnet (permanent magnet) near the three-phase AC motor M and a case where there is a magnet. If the magnet is absent near the three-phase AC motor M, Hall element signals Vh+ and Vh− of sine waves in which cross points with the reference voltage VR are present at constant intervals are generated in accordance with the rotation of a rotor magnet, thereby obtaining a pulse waveform having the output voltage Vout of the reference circuit 6R with a 50% duty.

On the other hand, if the magnet is present near the three-phase AC motor M, cross points of the Hall element signals Vh+ and Vh− with the reference voltage VR are not present at constant intervals in accordance with the rotation of the rotor magnet due to an offset component caused by the corresponding magnetic field, and thus, the output voltage Vout of the reference circuit 6R does not have a pulse waveform with a 50% duty.

Figure 5:
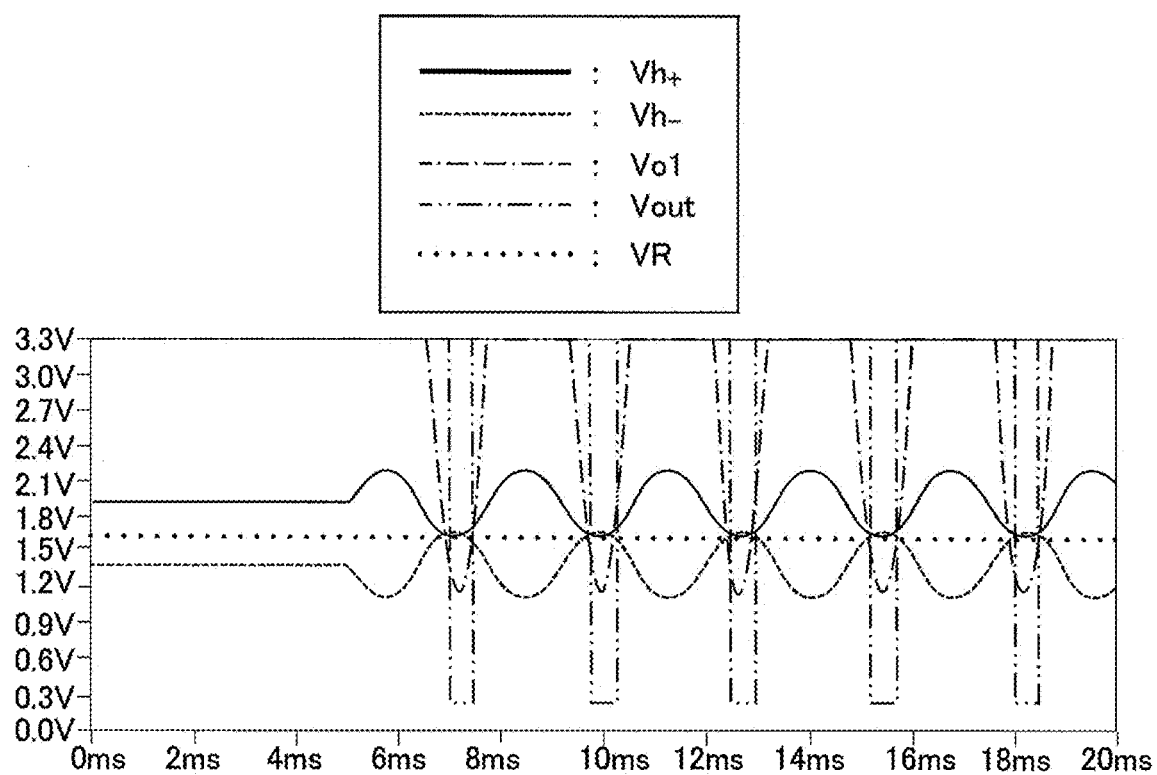
FIG. 5 is a timing chart showing the operation of the reference circuit when the external magnetic field is present.

For example, FIG. 5 shows a waveform in a case where that an amplitude of the Hall element signal in the reference circuit 6R is 0.6 Vp-p, a gain of the signal amplifier 60 is five times, and a component generated by an external magnetic field of 0.5 V (DC) is superimposed on the Hall element signal. As shown in FIG. 5, the interval between cross points of the Hall element signals Vh+ and Vh− is not constant due to the external magnetic field, and the duty ratio deviates from 50%.

Next, the arrangement of the Hall elements and the signal processing circuit of the present embodiment will be described with reference to FIGS. 6A to 10C.

Figure 6A:
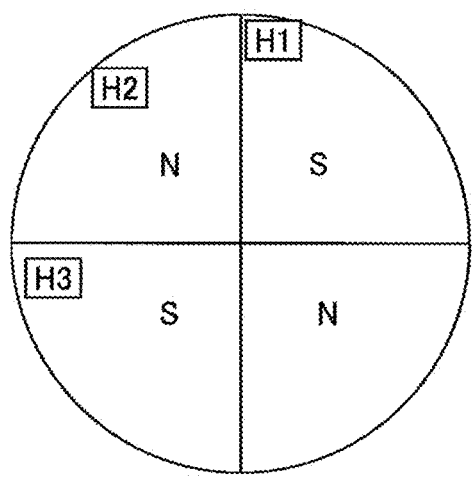
FIGS. 6A and 6B are views showing the arrangement of Hall elements of the motor drive system according to the first embodiment.
Figure 6B:
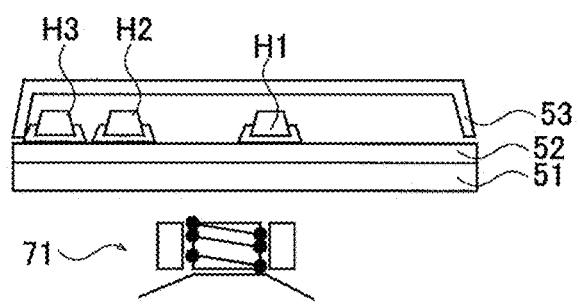
Figure 7:
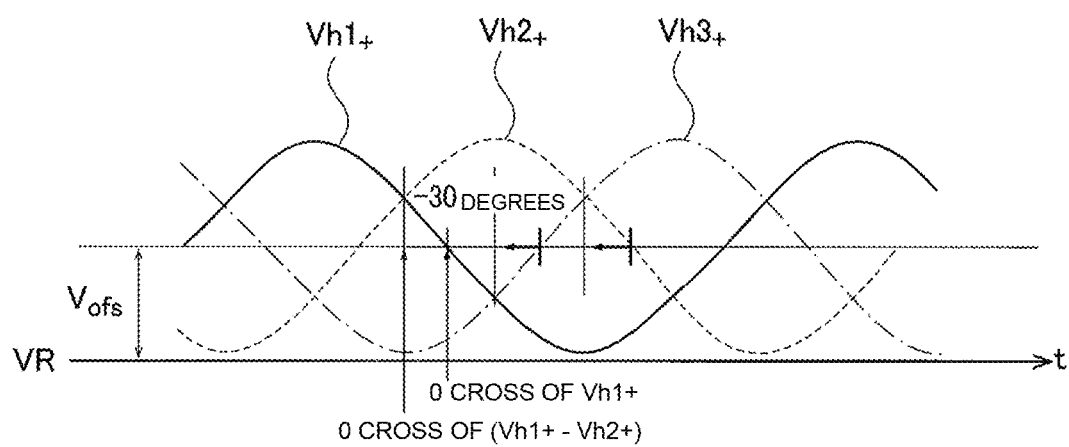
FIG. 7 is a view showing an example of an output waveform of the Hall element according to the first embodiment.
Figure 8:
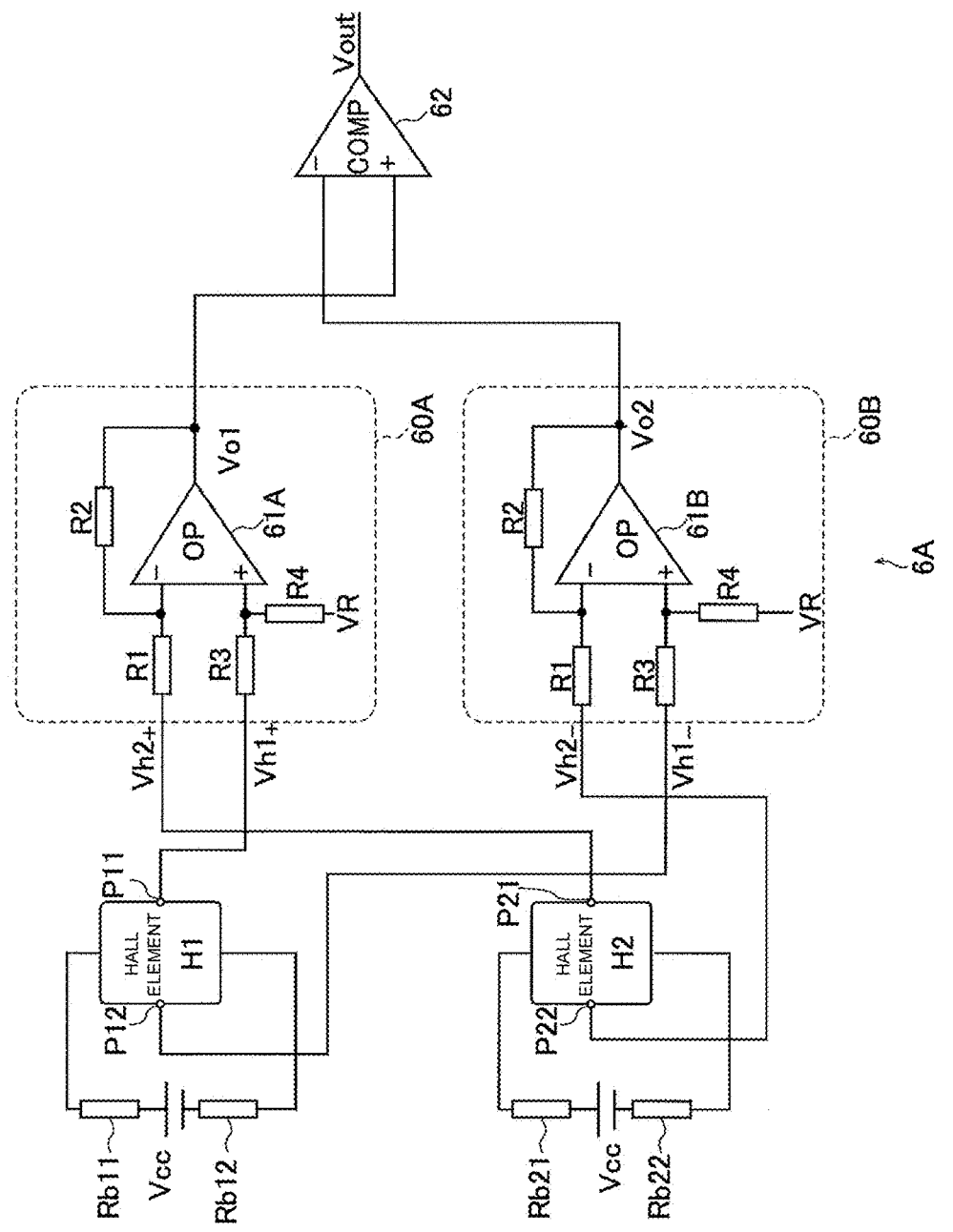
FIG. 8 is a circuit diagram of the signal processing circuit according to the first embodiment.

FIGS. 6A and 6B are views showing the arrangement of Hall elements of the motor drive system 1 according to the present embodiment. FIG. 7 is a view showing a simulation result of an output waveform of the Hall element in the present embodiment. FIG. 8 is a circuit diagram of the signal processing circuit 6A of the present embodiment. Each of FIGS. 9A to 10C is a timing chart showing the operation of the signal processing circuit 6A of the present embodiment.

FIG. 6A is the view showing the arrangement of the respective Hall elements H on a plane orthogonal to a rotation axis of the motor. FIG. 6B is a schematic cross-sectional view of the motor.

In the example shown in FIG. 6A, the number of poles of the three-phase AC motor M is four (that is, the number of pole pairs is two). In this case, the Hall elements H1 to H3 generate the signals mutually having the phase difference of 120 degrees ($\frac{2}{3}\pi$) (in electric angle), and thus, the Hall elements H1 to H3 are arranged to be shifted each by 60 degrees ($\pi/3$) based on the relationship of electric angle=mechanical angle×number of pole pairs.

Each of the Hall elements H1 to H3 is an example of a magnetic sensor.

As shown in FIG. 6B, a substrate 52 is arranged on a pedestal 51, and the Hall elements H1 to H3 are provided on the substrate 52, in the three-phase AC motor M of the present embodiment. The substrate 52 is circular, and a rotor magnet (hereinafter, simply referred to as "rotor" as appropriate) 53 is arranged so as to cover the substrate 52. Note that FIG. 6B shows a speaker 71 as an example of the external magnetic field.

In view of the above-described problem of the reference circuit 6R, the signal processing circuit 6A of the present embodiment removes the offset component caused by the external magnetic field by calculating a difference between two Hall element signals.

The principle of signal processing of the signal processing circuit 6A of the present embodiment will be described below with reference to FIG. 7. It is assumed a case where signals Vh1+ and Vh1− having mutually different polarities are output from the Hall element H1 corresponding to the U phase, signals Vh2+ and Vh2− having mutually different polarities are output from the Hall element H2 corresponding to the V phase, and signals Vh3+ and Vh3− having mutually different polarities are output from the Hall element H3 corresponding to the W phase. At this time, if an offset Vofs of a DC component is caused by the external magnetic field of the motor, the Hall element signals Vh1+, Vh2+, and Vh3+ are sine wave signals centered on VR+Vofs in which the offset Vofs caused by the external magnetic field is superimposed on the reference voltage VR, and each of the signals has a phase difference of 120 degrees ($\frac{2}{3}\pi$).

Therefore, a difference between the Hall element signals Vh1+ and Vh2+, for example, is obtained in order to remove the offset Vofs caused by the external magnetic field. In this example, the Hall element H1 is an example of a first magnetic sensor, and the Hall element H2 is an example of a second magnetic sensor.

Since each of the signals has the phase difference of 120 degrees ($\frac{2}{3}\pi$), the Hall element signals Vh1+, Vh2+, and Vh3+ can be expressed by the following Equations (1), (2), and (3), respectively.

[Equation 1]

$$Vh1_+ = \sin\theta + VR + V_{ofs} \tag{1}$$

[Equation 2]

$$Vh2_+ = \sin\left(\theta - \frac{2\pi}{3}\right) + VR + V_{ofs} \tag{2}$$

[Equation 3]

$$Vh3_+ = \sin\left(\theta + \frac{2\pi}{3}\right) + VR + V_{ofs} \tag{3}$$

Therefore, the difference between the Hall element signals Vh1+ and Vh2+ is expressed by the following Equation (4).

[Equation 4]

$$Vh1_+ - Vh2_+ = \sin\theta - \sin\left(\theta - \frac{2\pi}{3}\right) = \sqrt{3}\sin\left(\theta + \frac{\pi}{6}\right) \tag{4}$$

As shown in Equation (4), it is possible to remove the reference voltage VR and the offset Vofs caused by the external magnetic field by obtaining the difference between the two Hall element signals. Similarly, the reference voltage VR and the offset Vofs caused by the external magnetic field with respect to the V phase and the W phase can be removed by obtaining a difference between the Hall element signals Vh2+ and Vh3+ and obtaining a difference between the Hall element signals Vh3+ and Vh1+. In FIG. 7, it is understood that each cross point of the Hall element signals Vh1+ to Vh3+ of the Hall elements H1 to H3 with the line of VR+Vofs has a phase shifted by $\pi/6$ from the time when levels of the two Hall element signals coincide.

However, it should be noted that the phase of the difference between Vh1+ and Vh3+ advances by $\pi/6$ with respect to Vh1+ as shown in Equation (4). Since an electrical angle of $\pi/6$ is equivalent to a mechanical angle of 15 degrees, it is necessary to shift the arrangement of the Hall element by 15 degrees when no change is made on software by the CPU 5 that receives the Hall element signals or to perform position correction on the software by the CPU 5 in consideration of the phase shifted by $\pi/6$.

The signal processing circuit 6A based on the principle of signal processing, which has been described with reference to FIG. 7, will be described with reference to FIG. 8. Although the signal processing circuit 6A shown in FIG. 8 shows only the signal processing of the Hall element signal of the Hall element H1 corresponding to the U phase, the same applies to the signal processing for the Hall element signals of the Hall elements H2 and H3 respectively corresponding to the V phase and the W phase.

As shown in FIG. 8, the signal processing circuit 6A is provided with resistors Rb11 and Rb12 for the power supply voltage Vcc of the Hall element H1 and resistors Rb21 and Rb22 for the power supply voltage Vcc of the Hall element H2 in order to generate a predetermined bias voltage or bias current.

The pair of complementary signals, that is, the Hall element signal Vh1+ and the Hall element signal Vh1− are output from output terminals P11 and P12 of the Hall element H1, respectively. The Hall element signal Vh1+ and the Hall element signal Vh1− are sine wave signals having phases opposite to each other with respect to the reference voltage VR (that is, signals having different polarities with respect to the reference voltage VR). The Hall element signal Vh1+ is an example of a signal having a first polarity out of the first signal, and the Hall element signal Vh1− is an example of a signal having a second polarity out of the first signal.

Similarly, the pair of complementary signals, that is, the Hall element signal Vh2+ and the Hall element signal Vh2− are output from output terminals P21 and P22 of the Hall element H2, respectively. The Hall element signal Vh2+ and the Hall element signal Vh2− are sine wave signals having phases opposite to each other with respect to the reference voltage VR (that is, signals having different polarities with respect to the reference voltage VR). The Hall element signal Vh2+ is an example of a signal having the first polarity out of the second signal, and the Hall element signal Vh2− is an example of a signal having the second polarity out of the second signal.

In the example of the present embodiment, the reference voltage VR is a voltage of a half level of the power supply voltage Vcc.

The signal processing circuit 6A includes signal amplifiers 60A and 60B and the comparator 62. The signal amplifier 60A includes a differential amplifier 61A and the resistors R1 to R4. The signal amplifier 60B includes a differential amplifier 61B and the resistors R1 to R4.

The differential amplifier 61A is a differential amplifier, amplifies the difference between the signal Vh1+ of the Hall element H1 and the signal Vh2+ of the Hall element H2, and outputs a signal of the voltage Vo1. The resistor R1 is provided between the output terminal P21 of the Hall element H2 and an inverting input terminal of the differential amplifier 61A, and the resistor R3 is provided between the output terminal P11 of the Hall element H1 and a non-inverting input terminal of the differential amplifier 61A.

The feedback resistor R2 is provided between the inverting input terminal and an output terminal of the differential amplifier 61A. One end of the resistor R4 is connected to the non-inverting input terminal of the differential amplifier 61A, and the other end of the resistor R4 is set to the reference voltage VR.

Typically, the signal amplifier 60A is set such that R2/R1=R4/R3, and this value becomes an amplification factor (gain) of the signal amplifier 60A.

The differential amplifier 61B is a differential amplifier, amplifies the difference between the signal Vh1− of the Hall element H1 and the signal Vh2− of the Hall element H2, and outputs a signal of a voltage Vo2. The resistor R1 is provided between the output terminal P22 of the Hall element H2 and an inverting input terminal of the differential amplifier 61B, and the resistor R3 is provided between the output terminal P12 of the Hall element H1 and a non-inverting input terminal of the differential amplifier 61B.

The feedback resistor R2 is provided between the inverting input terminal and an output terminal of the differential amplifier 61B. One end of the resistor R4 is connected to the non-inverting input terminal of the differential amplifier 61B, and the other end of the resistor R4 is set to the reference voltage VR.

Typically, the signal amplifier 60B is set such that R2/R1=R4/R3, and this value becomes an amplification factor (gain) of the signal amplifier 60B.

The comparator 62 compares the signal (output voltage Vo1) amplified and output by the signal amplifier 60A and the signal (output voltage Vo2) amplified and output by the signal amplifier 60B, and outputs a binary pulse signal (output voltage Vout) indicating a result of the comparison. This pulse signal is supplied to the CPU 5.

Although the circuit example shown in FIG. 8 shows the case where the signal Vh1+ and the signal Vh1− of the Hall element H1 are input to the non-inverting input terminal, and the signal Vh2+ and the signal Vh2− of the Hall element H2 are input to the inverting input terminal, the present disclosure is not limited thereto. Conversely, the signal Vh1+ and the signal Vh1− of the Hall element H1 may be input to the inverting input terminal, and the signal Vh2+ and the signal Vh2− of the Hall element H2 may be input to the non-inverting input terminal. In such a case, the output voltages Vo1 and Vo2 of the signal amplifiers 60A and 60B have opposite phases to those in the case of FIG. 8, and the output voltage Vout of the comparator 62 also has the opposite phase to that in the case of FIG. 8.

FIGS. 9A to 10E show results of simulation performed under a condition that the power supply voltage Vcc of the Hall element H is 3.3 V, each gain of the signal amplifiers 60A and 60B is twice, and a signal (U-phase signal) from the rotor magnet has an amplitude of 0.2 Vp-p and a frequency of 360 Hz.

FIGS. 9A to 9E show a case where a DC signal having an amplitude of 0.5 V is superimposed as an external magnetic field, and FIGS. 10A to 10E show a case where a signal having an amplitude of 0.5 V and a frequency of 1 kHz is superimposed on a DC offset of 0.5 V as an external magnetic field.

Figure 9A:
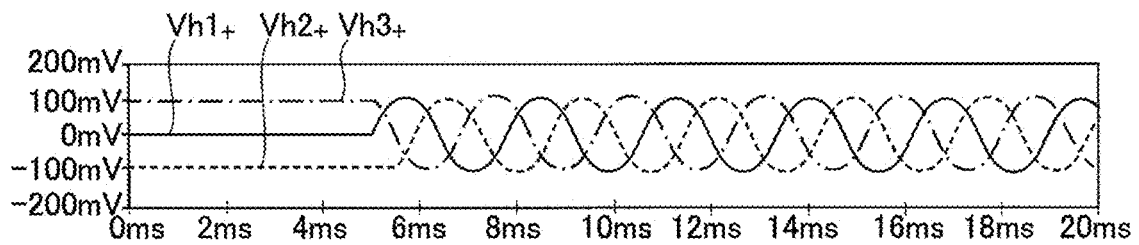
FIGS. 9A to 9E are timing charts showing the operation of the signal processing circuit according to the first embodiment.
Figure 10A:
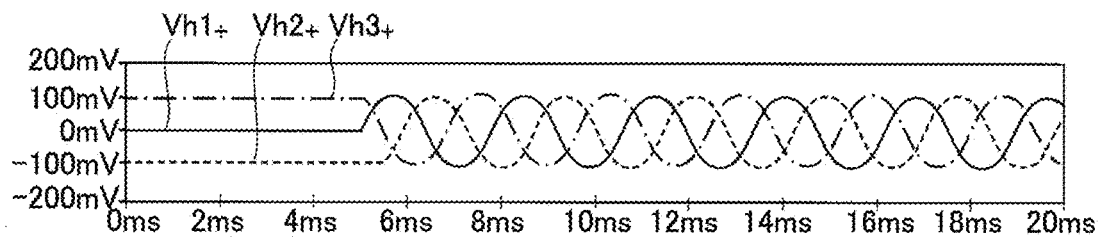
FIGS. 10A to 10E are timing charts showing the operation of the signal processing circuit according to the first embodiment.

FIGS. 9A and 10A both show the Hall element signals Vh1+, Vh2+, and Vh3+ of the Hall elements H1 to H3 due to only a magnetic field generated by the rotation of the rotor.

Figure 9B:
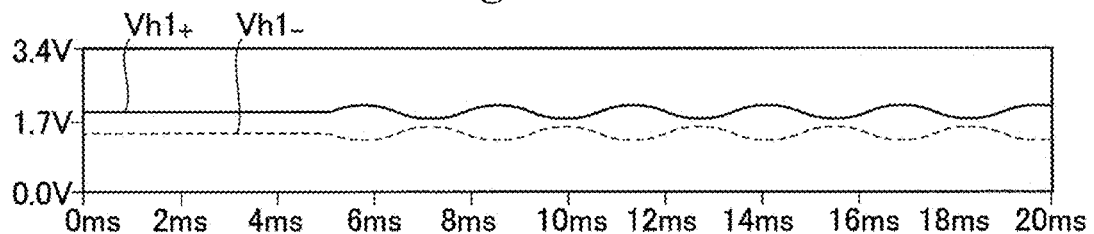
Figure 9C:
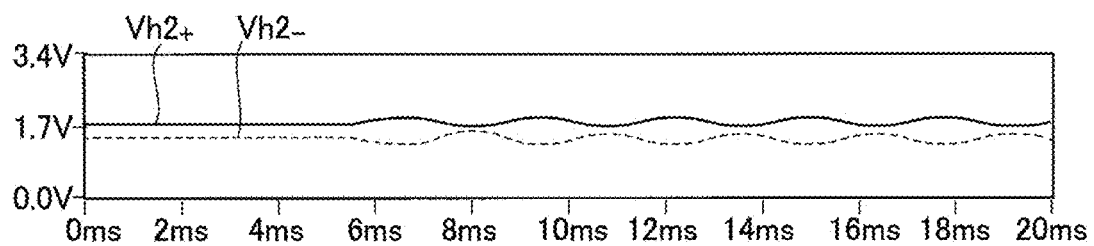
Figure 10B:
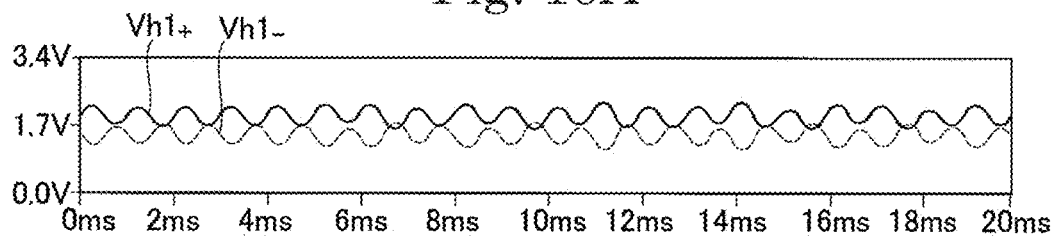
Figure 10C:
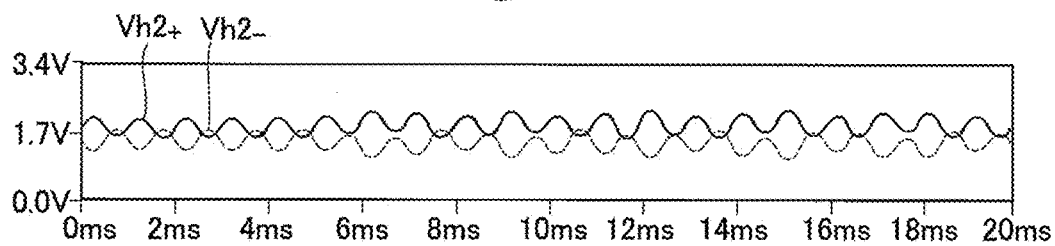

FIGS. 9B and 10B both show waveforms of the Hall element signals Vh1+ and Vh1− of the Hall element H1 on which a component caused by the external magnetic field is superimposed. FIGS. 9C and 10C both show waveforms of the Hall element signals Vh2+ and Vh2− of the Hall element H2 on which a component caused by the external magnetic field is superimposed.

Figure 9D:
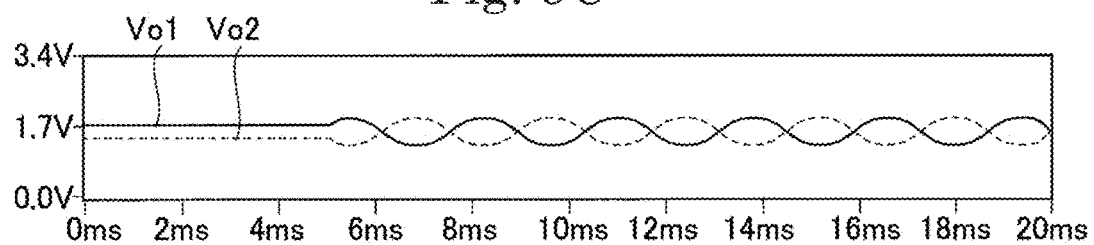
Figure 9E:
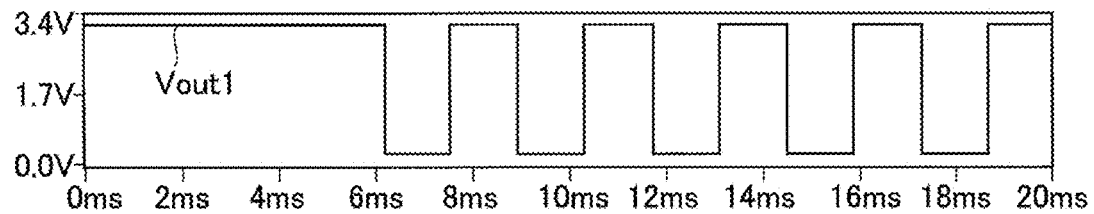
Figure 10D:
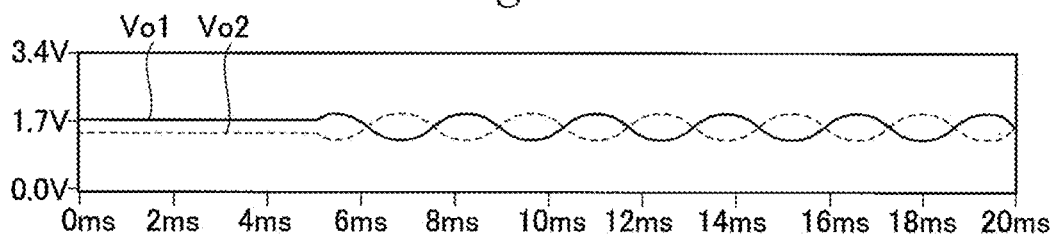
Figure 10E:
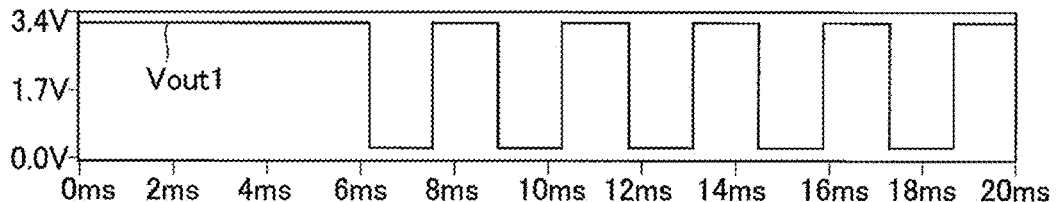

In each case, the offset component is removed as shown in FIG. 9D (voltages Vo1 and Vo2) and FIG. 10D (voltages Vo1 and Vo2). In addition, it is understood that the duty ratio of the output voltage is 50% as shown in FIG. 9E (output voltage Vout1) and FIG. 10E (output voltage Vout1).

As described above, the motor drive system 1 of the present embodiment is configured to remove the signal component caused by the external magnetic field by obtaining the difference between two of the Hall element signals of the Hall elements H1 to H3 that detect the rotational position of the rotor and amplifying the difference. That is, the signal amplifiers 60A and 60B amplify the differences between, for example, the Hall element signals Vh1+ and Vh1− (examples of a first signal) of the Hall element H1 and the Hall element signals Vh2+ and Vh2− (examples of second signal) of the Hall element H2, respectively. The comparator 62 converts the output voltages Vo1 and Vo2 of the signal amplifiers 60A and 60B into the output voltage Vout which is the pulse signal. Therefore, even if a noise signal level caused by the external magnetic field is DC or has a frequency component, the noise can be removed.

Next, a motor drive system according to a second embodiment will be described with reference to FIGS. 11 to 14F.

Only a signal processing circuit is different from the motor drive system 1 of the first embodiment in a motor drive system according to each of the following embodiments, and thus, only the signal processing circuit will be described.

Figure 11:
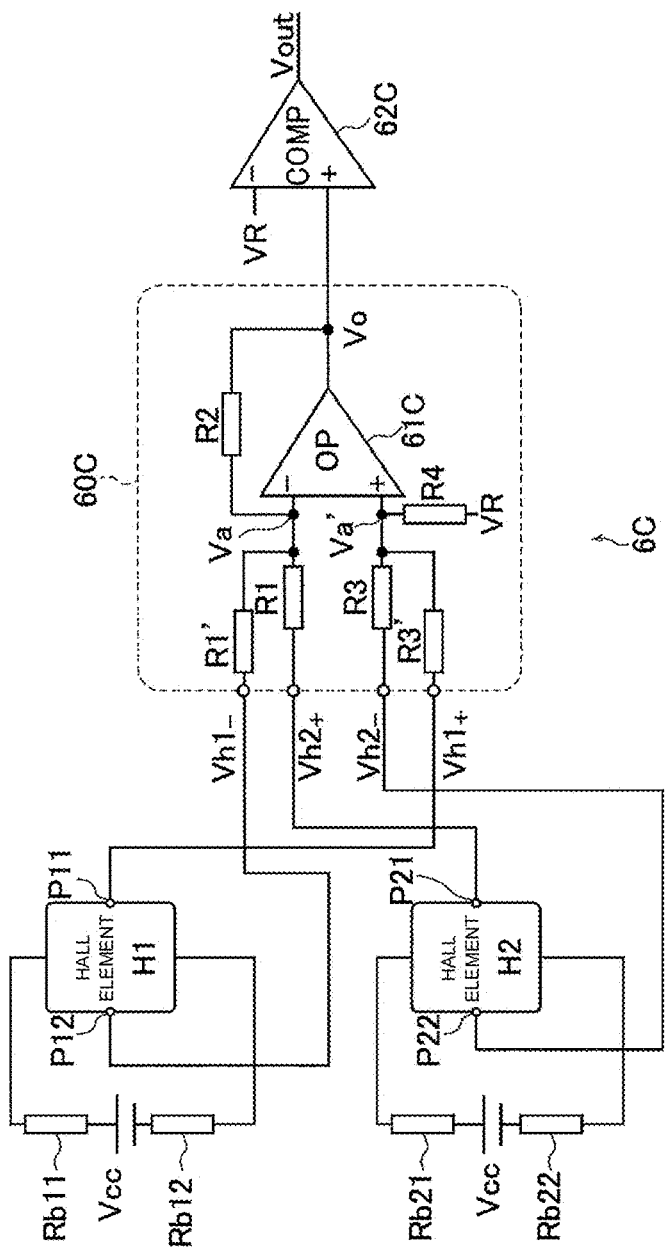
FIG. 11 is a circuit diagram of a signal processing circuit according to a second embodiment.

FIG. 11 is a circuit diagram of a signal processing circuit 6C of the present embodiment. Each of FIGS. 12A to 14F is a timing chart showing the operation of the signal processing circuit 6C of the present embodiment.

As understood by comparing FIG. 11 with FIG. 8, a signal amplifier 60C of the signal processing circuit 6C of the present embodiment is configured using a circuit in which the number of differential amplifiers is reduced from two to one.

More specifically, the Hall element signal Vh1− of the Hall element H1 and the Hall element signal Vh2+ of the Hall element H2 are input in parallel to an inverting input terminal (an example of a first input terminal) of a differential amplifier 61C of the signal amplifier 60C via resistors R1' and R1. The Hall element signal Vh1+ of the Hall element H1 and the Hall element signal Vh2− of the Hall element H2 are input in parallel to a non-inverting input terminal (an example of a second input terminal) of the differential amplifier 61C via resistors R3' and R3. The differential amplifier 61C amplifies a difference between these inputs at a predetermined amplification factor based on the reference voltage VR. The feedback resistor R2 is provided between an output terminal and the inverting input terminal of the differential amplifier 61C.

In the present embodiment, the Hall element signal Vh1+ of the Hall element H1 is an example of a signal having a first polarity out of the first signal, and the Hall element signal Vh1− of the Hall element H1 is an example of a signal having a second polarity out of the first signal. In addition, the Hall element signal Vh2+ of the Hall element H2 is an example of a signal having the first polarity out of the second signal, and the Hall element signal Vh2− of the Hall element H2 is an example of a signal having the second polarity out of the second signal.

In FIG. 11, typically, R1=R1'=R3=R3'. In such a case, the amplification factor (gain) of the signal amplifier 60C is R2/R1 (=R4/R3).

The comparator 62C of the present embodiment outputs the pulse signal (output voltage Vout) based on the comparison result between the output voltage Vo1 of the differential amplifier 61C and the reference voltage VR.

The signal processing circuit 6C shown in FIG. 11 is substantially equivalent to the signal processing circuit 6A shown in FIG. 8. This point will be described hereinafter.

When a voltage at the inverting input terminal of the differential amplifier 61C is Va and a voltage at the non-inverting input terminal is Va', the following Equations (1) and (2) are established.

[Equation 1]

$$\frac{V'_a - VR}{R4} = \frac{Vh2_- - V'_a}{R3} + \frac{Vh1_+ - V'_a}{R3'} \quad (1)$$

[Equation 2]

$$\frac{Va - Vo}{R2} = \frac{Vh1_- - Va}{R1'} + \frac{Vh2_+ - Va}{R1} \quad (2)$$

Here, when $R1=R1'=R3=R3'=R$ and $R2=R4=kR$ (k: gain), Equations (1) and (2) are expressed as Equations (3) and (4), respectively.

[Equation 3]
$$V'_a = \frac{k}{1+2k}(Vh1_+ + Vh2_-) + \frac{1}{1+2k}VR \quad (3)$$

[Equation 4]
$$Va = \frac{k}{1+2k}(Vh1_- + Vh2_+) + \frac{1}{1+2k}Vo \quad (4)$$

Since Va=Va' using an imaginary short, the following Equation (5) is obtained from Equations (3) and (4).

[Equation 5]
$$Vo=k(Vh2_- - Vh2_+ + Vh1_+ - Vh1_-) + VR \quad (5)$$

Therefore, the comparison result obtained by the comparator 62C is expressed by the following Equation (6).

[Equation 6]
$$Vo-VR=k(Vh2_- - Vh2_+ + Vh1_+ - Vh1_-) \quad (6)$$

On the other hand, in the signal processing circuit 6A of FIG. 8, the following Equations (7) and (8) are established for each of the signal amplifiers 60A and 60B.

[Equation 7]
$$Vo1=k(Vh1_+ - Vh2_+) + VR \quad (7)$$

[Equation 8]
$$Vo2=k(Vh1_- - Vh2_-) + VR \quad (8)$$

Therefore, the comparison result obtained by the comparator 62 is expressed by the following Equation (9).

[Equation 9]
$$Vo1-Vo2=k(Vh2_- - Vh2_+ + Vh1_+ - Vh1_-) \quad (9)$$

As shown in Equations (6) and (9), it is understood that the signal processing circuit 6C of the present embodiment is equivalent to the signal processing circuit 6A of FIG. 8.

FIGS. 12A to 13E show results of simulation performed under a condition that the power supply voltage Vcc of the Hall element H is 3.3 V, a gain of the signal amplifier 60C is twice, and each signal (U-phase, V-phase, or W-phase signal) from the rotor magnet has an amplitude of 0.2 Vp-p and a frequency of 360 Hz. FIGS. 12A to 12E show a case where a DC signal having an amplitude of 0.5 V is superimposed as an external magnetic field, and FIGS. 13A to 13E show a case where a signal having an amplitude of 0.5 V and a frequency of 1 kHz is superimposed on a DC offset of 0.5 V as an external magnetic field.

Figure 12A:
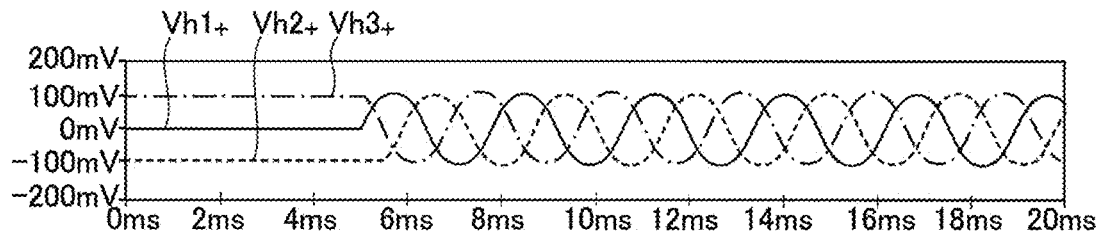
FIGS. 12A to 12E are timing charts showing the operation of the signal processing circuit of the second embodiment.
Figure 13A:
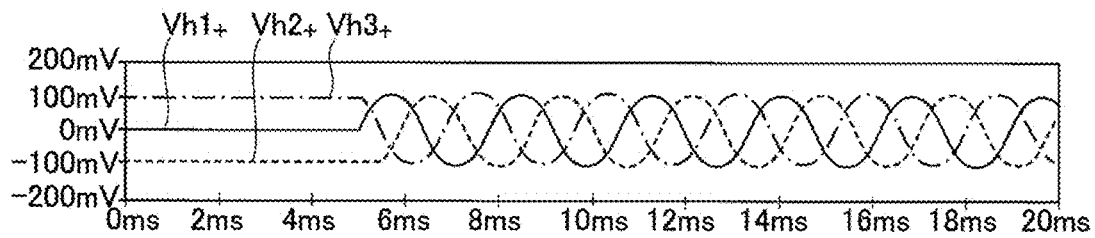
FIGS. 13A to 13E are timing charts showing the operation of the signal processing circuit of the second embodiment.

FIGS. 12A and 13A both show the Hall element signals Vh1+, Vh2+, and Vh3+ of the Hall elements H1 to H3 due to only a magnetic field generated by the rotation of the rotor.

Figure 12B:
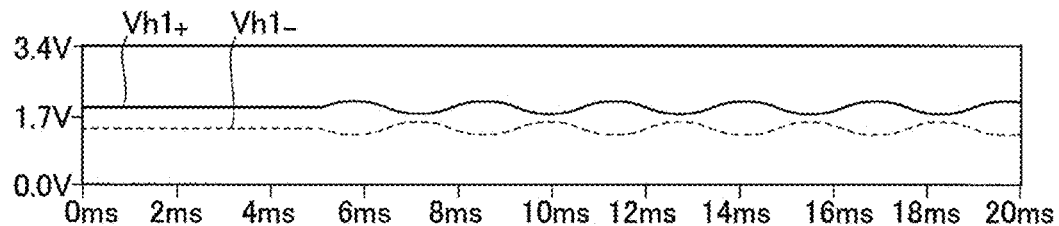
Figure 12C:
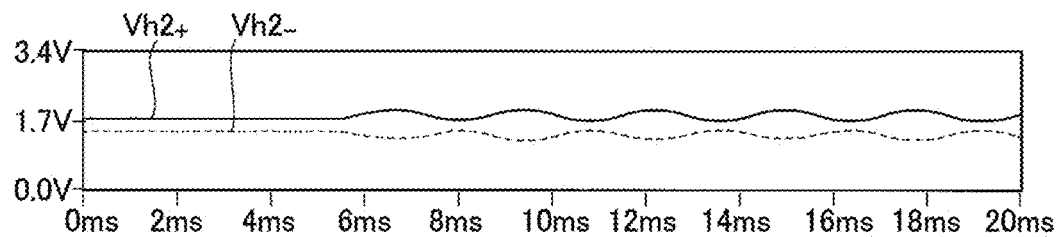
Figure 13B:
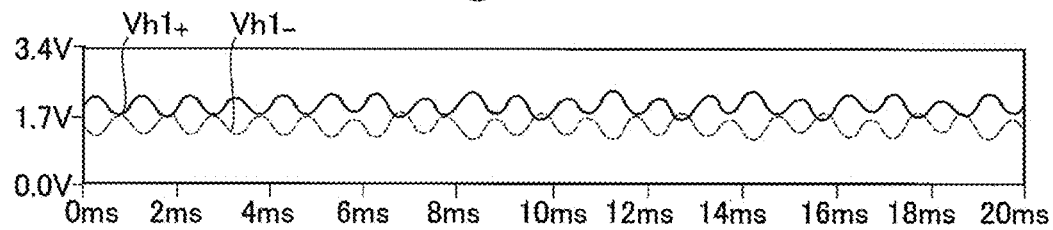
Figure 13C:
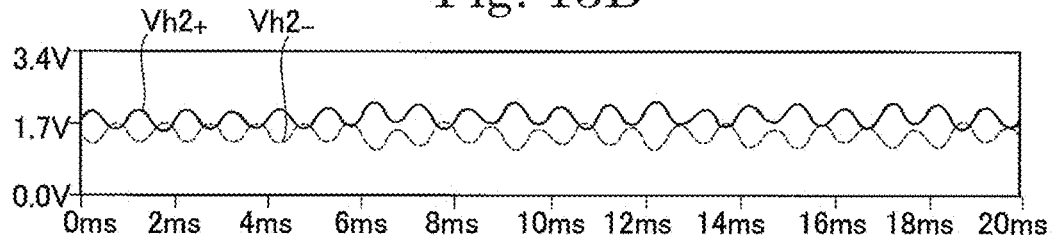

FIGS. 12B and 13B both show waveforms of the Hall element signals Vh1+ and Vh1- of the Hall element H1 on which a component caused by the external magnetic field is superimposed. FIGS. 12C and 13C both show waveforms of the Hall element signals Vh2+ and Vh2- of the Hall element H2 on which a component caused by the external magnetic field is superimposed.

Figure 12D:
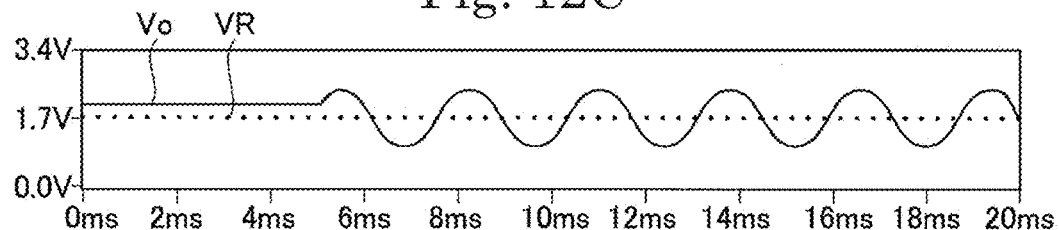
Figure 12E:
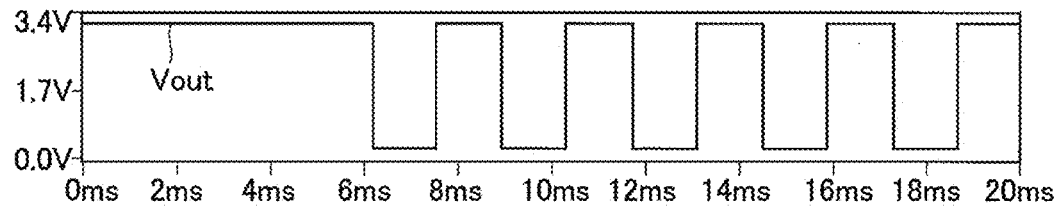
Figure 13D:
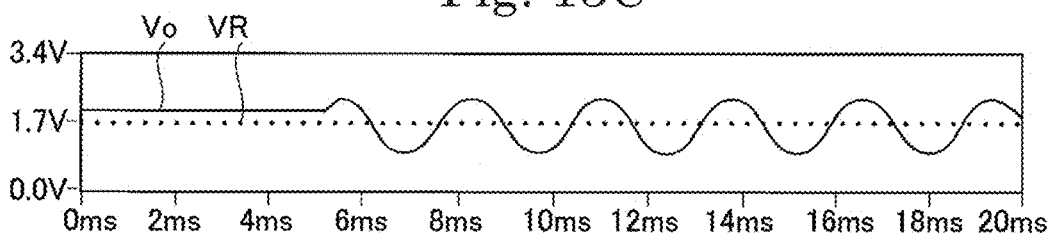
Figure 13E:
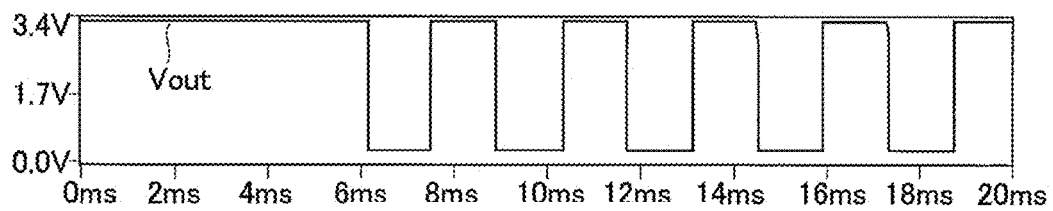

In each case, it is understood that the signal component of the external magnetic field has been removed and the duty ratio of the output voltage Vout is 50% as shown in FIG. 12D (voltage Vo1), FIG. 12E (output voltage Vout), FIG. 13D (voltage Vo1), and FIG. 13E (output voltage Vout).

FIGS. 14A to 14F show timing charts (simulation results) based on simulation results when the signal processing circuit 6C of the present embodiment is applied to all of the U, V, and W phases. FIGS. 14A to 14F show a case where an external magnetic field under the same condition as in FIGS. 13A to 13E, that is, the signal having the amplitude of 0.5 V and the frequency of 1 kHz is superimposed on the DC offset of 0.5 V as the external magnetic field.

Figure 14A:
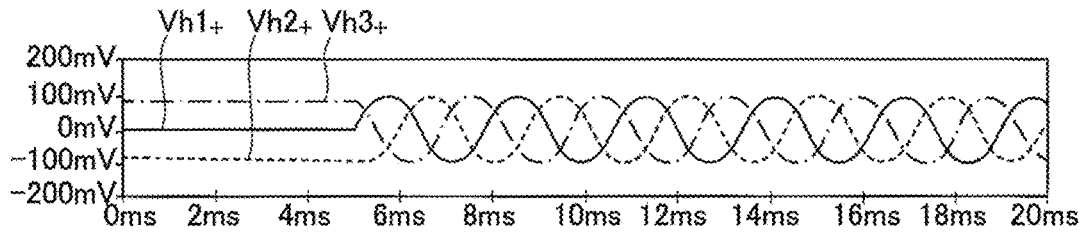
FIGS. 14A to 14F are timing charts showing the operation of the signal processing circuit according to the second embodiment.

FIG. 14A shows waveforms of the Hall element signals Vh1+, Vh2+, and Vh3+ of the Hall elements H1, H2, and H3, the signal waveforms each having only the signal component from the rotor magnet (that is, having no component of the external magnetic field). This signal is a sine wave of 0.2 Vp-p.

Figure 14B:
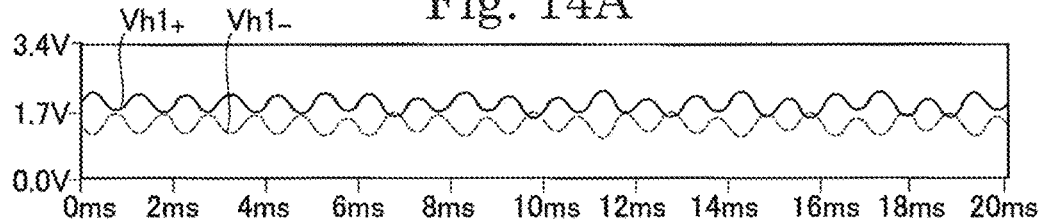
Figure 14C:
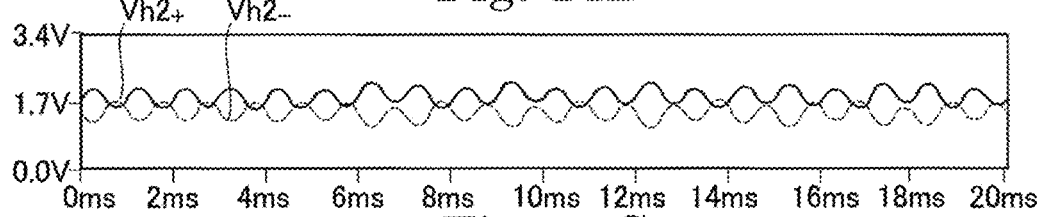
Figure 14D:
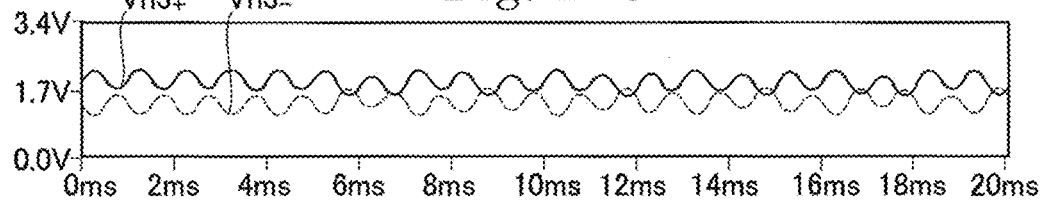

FIG. 14B shows waveforms of the Hall element signals Vh1+ and Vh1- of the Hall element H1 when a signal component caused by the external magnetic field is superimposed on a signal component (0.2 Vp-p) from the rotor magnet. FIG. 14C shows waveforms of the Hall element signals Vh2+ and Vh2- of the Hall element H2 when a signal component caused by the external magnetic field is superimposed on the signal component (0.2 Vp-p) from the rotor magnet. FIG. 14D shows waveforms of the Hall element signals Vh3+ and Vh3- of the Hall element H3 when a signal component caused by the external magnetic field is superimposed on the signal component (0.2 Vp-p) from the rotor magnet.

Figure 14E:
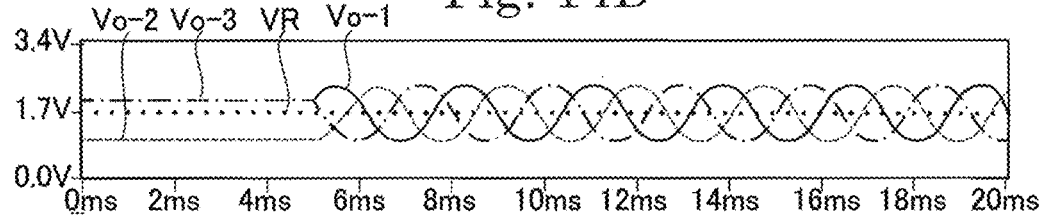

In FIG. 14E, a voltage Vo-1 is the same as the output voltage Vo of the differential amplifier 61C of the signal processing circuit 6C in FIG. 11. A voltage Vo-2 is an output voltage Vo when processing has been performed on the signals of the Hall elements H2 and H3 by a circuit similar to the signal processing circuit 6C in FIG. 11. A voltage Vo-3 is an output voltage Vo when processing has been performed on the signals of the Hall elements H3 and H1 by a circuit similar to the signal processing circuit 6C in FIG. 11.

As shown in FIG. 14E, the signal component caused by the external magnetic field has been removed from the voltages Vo-1, Vo-2, and Vo-3, and sinusoidal waveforms having a phase difference of 120 degrees from each other are obtained.

Figure 14F:
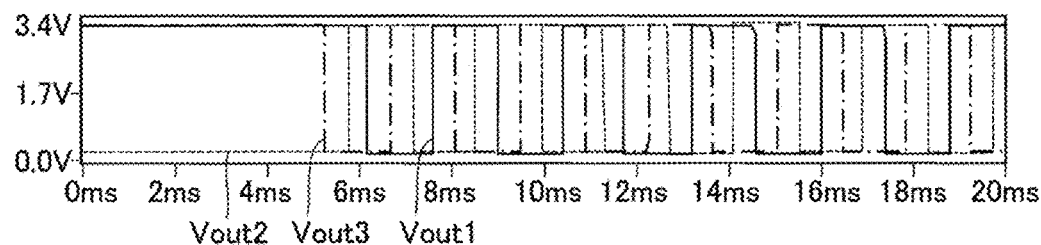

In FIG. 14F, an output voltage Vout1 is the same as the output voltage Vout of the signal processing circuit 6C in FIG. 11. An output voltage Vout2 is an output voltage Vout when processing has been performed on the signals of the Hall elements H2 and H3 by a circuit similar to the signal processing circuit 6C in FIG. 11. An output voltage Vout3 is an output voltage Vout when processing has been performed on the signals of the Hall elements H3 and H1 by a circuit similar to the signal processing circuit 6C in FIG. 11.

As shown in FIG. 14F, it has been confirmed that the output voltages Vout1, Vout2, and Vout3 were shifted by 120 degrees from each other and the duty ratio of 50% was obtained in the output voltages of the respective phases.

As described above, the embodiments of the motor according to the present disclosure have been described in detail. However, a scope of the present disclosure is not limited to the above embodiments. In addition, the above-described embodiments can be variously improved or changed within the scope not departing from a gist of the present disclosure. The technical matters described in each of the plurality of embodiments can be appropriately combined.

For example, the case where the on/off control of each driving MOS transistor of the three-phase voltage generation unit 10 is performed by 120-degree energization based on position information of a Hall sensor has been described in the above-described embodiments, but the disclosure is not limited thereto. As an on/off control method of each driving MOS transistor, another energization control method such as 180-degree energization may be applied.

Although the case where the number N of pole pairs of the motor is two has been described in the above-described embodiments, the present disclosure is not limited thereto. The number of pole pairs of the motor may be any value, and the arrangement of the Hall element (for example, the Hall element H1a) that inverts the signal of the Hall element (for example, the Hall element H1) corresponding to each phase is determined according to this value.

Features of the above-described preferred embodiments and the modifications thereof may be combined appropriately as long as no conflict arises.

While preferred embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A motor comprising:
   a first magnetic sensor that detects a rotational position of a rotor;
   a second magnetic sensor that is arranged at a predetermined mechanical angle with respect to the first magnetic sensor and detects the rotational position of the rotor;
   a signal amplifier that amplifies a difference between a first signal which is a signal output from the first magnetic sensor and a second signal which is a signal output from the second magnetic sensor; and
   a pulse signal generator that converts an output signal of the signal amplifier into a pulse signal.

2. The motor according to claim 1, wherein
   the first signal has a pair of signals having different polarities with respect to the reference voltage,
   the second signal has a pair of signals having different polarities with respect to the reference voltage,
   the signal amplifier comprises:
   a first differential amplifier that receives a signal having a first polarity out of the first signal and a signal having the first polarity out of the second signal as differential input signals and performs amplification at a predetermined amplification factor based on the reference voltage; and
   a second differential amplifier that receives a signal having a second polarity out of the first signal and a signal having the second polarity out of the second signal as differential input signals and performs amplification at a predetermined amplification factor based on the reference voltage, and
   the pulse signal generator generates the pulse signal based on a comparison result between an output signal of the first differential amplifier and an output signal of the second differential amplifier.

3. The motor according to claim 1, wherein
   the first signal has a pair of signals having different polarities with respect to the reference voltage,
   the second signal has a pair of signals having different polarities with respect to the reference voltage,
   the signal amplifier comprises a differential amplifier that includes: a first input terminal to which a signal having a second polarity out of the first signal and a signal having a first polarity out of the second signal are input in parallel; and a second input terminal to which a signal having the first polarity out of the first signal and a signal having the second polarity out of the second signal are input in parallel, and performs amplification at a predetermined amplification factor based on the reference voltage, and
   the pulse signal generator generates the pulse signal based on a comparison result between an output signal of the differential amplifier and the reference voltage.

* * * * *